United States Patent
Chen et al.

(10) Patent No.: US 10,383,440 B2
(45) Date of Patent: Aug. 20, 2019

(54) SUPPORTING DEVICE FOR RAIL MEMBER

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 105 days.

(21) Appl. No.: 15/628,665

(22) Filed: Jun. 21, 2017

(65) Prior Publication Data
US 2018/0140093 A1    May 24, 2018

(30) Foreign Application Priority Data

Nov. 22, 2016  (TW) .............................. 105138537 A (51) Int. Cl.
| | |
|---|---|
| *A47B 88/423* | (2017.01) |
| *A47B 88/493* | (2017.01) |
| *H05K 7/14* | (2006.01) |
| *H05K 7/18* | (2006.01) |

(52) U.S. Cl.
CPC .......... *A47B 88/423* (2017.01); *A47B 88/493* (2017.01); *H05K 7/1489* (2013.01); *H05K 7/183* (2013.01)

(58) Field of Classification Search
CPC .. A47B 88/423; A47B 88/493; H05K 7/1489; H05K 7/183
See application file for complete search history.

(56) References Cited

U.S. PATENT DOCUMENTS

| | | | | | |
|---|---|---|---|---|---|
| 1,231,291 | A | * | 6/1917 | Otte | .............................. 16/94 R |
| 3,488,097 | A | * | 1/1970 | Fall | ....................... A47B 88/493 312/334.11 |
| 3,687,505 | A | * | 8/1972 | Fall | ......................... F16C 29/04 312/110 |
| 3,712,690 | A | * | 1/1973 | Fall | ...................... A47B 88/493 384/18 |

(Continued)

FOREIGN PATENT DOCUMENTS

| | | |
|---|---|---|
| EP | 3 154 320 A2 | 4/2017 |
| TW | 522670 | 3/2003 |
| TW | I552670 B | 10/2016 |

*Primary Examiner* — Eret C McNichols
(74) *Attorney, Agent, or Firm* — Winston Hsu (57) ABSTRACT

A supporting device for rail member includes a first supporting frame, a second supporting frame and a third supporting frame. The first supporting frame has a pair of first supporting features for supporting the second supporting frame. The second supporting frame is movably attached to the first supporting frame. The second supporting frame has a pair of second supporting features for supporting the third supporting frame. The third supporting frame is movably attached to the second supporting frame. One of the first supporting frame and the third supporting frame is fixedly attached to a rail member.

22 Claims, 10 Drawing Sheets

(56) References Cited

U.S. PATENT DOCUMENTS

| | | | | |
|---|---|---|---|---|
| 3,738,716 | A * | 6/1973 | Lambert | A47B 88/437 384/18 |
| 4,440,461 | A * | 4/1984 | Powell | A47B 88/417 312/334.8 |
| 4,988,214 | A * | 1/1991 | Clement | A47B 88/493 312/333 |
| 5,033,805 | A * | 7/1991 | Hobbs | A47B 88/493 312/333 |
| 5,419,639 | A * | 5/1995 | Hobbs | F16C 29/04 384/18 |
| 6,350,001 | B1 * | 2/2002 | Chu | A47B 88/493 312/334.11 |
| 6,554,379 | B2 * | 4/2003 | Devine | A47B 88/57 292/81 |
| 6,749,275 | B2 | 6/2004 | Cutler | |
| 6,988,626 | B2 * | 1/2006 | Varghese | G06F 1/16 211/131.1 |
| 8,028,965 | B2 | 10/2011 | Chen | |
| 8,147,011 | B2 * | 4/2012 | Chen | H05K 7/1489 312/333 |
| 8,894,166 | B2 * | 11/2014 | Laible | F25D 25/025 312/319.1 |
| 9,328,769 | B1 | 5/2016 | Chen | |
| 9,723,746 | B2 * | 8/2017 | Chen | H05K 7/1489 |
| 10,130,001 | B2 * | 11/2018 | Chen | H05K 7/1489 |
| 10,149,538 | B2 * | 12/2018 | Chen | H05K 7/1489 |
| 10,159,343 | B2 * | 12/2018 | Chen | A47B 88/423 |
| 2014/0265788 | A1 * | 9/2014 | Judge | H05K 7/1489 312/334.1 |
| 2014/0363109 | A1 * | 12/2014 | Chen | A47B 88/43 384/22 |
| 2017/0363144 | A1 * | 12/2017 | Chen | F16C 29/004 |

* cited by examiner

SUPPORTING DEVICE FOR RAIL MEMBER

BACKGROUND OF THE INVENTION

1. Field of the Invention

The present invention relates to a supporting device for rail member.

2. Description of the Prior Art

Generally, in a rack system, a slide rail assembly or a slide rail can be mounted to posts of a rack by brackets. Wherein, an adjustable bracket is developed for market requirements. U.S. Pat. No. 8,028,965B2 discloses an adjustable bracket. The adjustable bracket comprises a fixing base (30) arranged on a slide assembly (10). A sliding member (50) is movable relative to the fixing base (30), such that a fixing member (70) connected to the sliding member (50) can be adjust through the sliding member (50) to allow the slide assembly to be mounted to two posts at different distances from each other, that is mounted to racks with different depths. Therefore, the case is provided for reference.

However, for different market requirements, it is important to develop a product to increase a supporting span of the bracket and improve overall structural strength between the slide rail and the bracket.

SUMMARY OF THE INVENTION

The present invention relates to a supporting device for rail member, wherein the supporting device is adjustable to have a longer supporting span.

According to an embodiment of the present invention, a supporting device for rail member comprises a first supporting frame having a first longitudinal body, a pair of first transverse parts being arranged on the first longitudinal body, each of the first transverse parts having a first supporting feature; a second supporting frame movably attached to the first supporting frame, the second supporting frame having a second longitudinal body, a pair of second transverse parts being arranged on the second longitudinal body, each of the second transverse parts having a second supporting feature; and a third supporting frame movably attached to the second supporting frame, the third supporting frame having a third longitudinal body. Wherein, one of the first supporting frame and the third supporting frame is fixedly attached to a rail member. Wherein, the first supporting feature of the first supporting frame is configured to support the second supporting frame, and the second supporting feature of the second supporting frame is configured to support the third supporting frame.

Preferably, when the first supporting frame is fixedly attached to the rail member, a first bracket is arranged on one of the rail member and the first supporting frame, and a second bracket is arranged on one of the second supporting frame and the third supporting frame. Each of the first and second brackets comprises a side wall and an end wall substantially perpendicularly connected to the side wall.

Preferably, when the third supporting frame is fixedly attached to the rail member, a first bracket is arranged on one of the rail member and the third supporting frame, and a second bracket is arranged on one of the first supporting frame and the second supporting frame. Each of the first and second brackets comprises a side wall and an end wall substantially perpendicularly connected to the side wall.

Preferably, the first supporting feature of the first supporting frame comprises a first supporting section and a first extension section substantially perpendicularly connected to the first supporting section. The first supporting section is substantially perpendicularly extended from the first longitudinal body of the first supporting frame. A first supporting space is defined by the first longitudinal body and the pair of first supporting sections. The first extension section is located outside the first supporting space.

Preferably, the second supporting feature of the second supporting frame comprises a second supporting section and a second extension section substantially perpendicularly connected to the second supporting section. The second supporting section is substantially perpendicularly extended from the second longitudinal body of the second supporting frame. A second supporting space is defined by the second longitudinal body, the pair of second supporting sections and the pair of second extension sections. The first extension section of the first supporting feature of the first supporting frame is located inside the second supporting space to support the second supporting frame.

Preferably, the third supporting frame comprises a pair of third supporting features arranged on the third longitudinal body. The third supporting feature of the third supporting frame comprises a third supporting section and a third extension section substantially perpendicularly connected to the third supporting section. The third supporting section is substantially perpendicularly extended from the third longitudinal body of the third supporting frame. A third supporting space is defined by the third longitudinal body, the pair of third supporting sections and the pair of third extension sections. The second supporting section and the second extension section of the second supporting feature of the second supporting frame are located inside the third supporting space to support the third supporting frame.

Preferably, the first supporting feature of the first supporting frame comprises a first supporting section extended from the first longitudinal body of the first supporting frame to form a first angle therebetween. A first supporting space is defined by the first longitudinal body and the pair of first supporting sections.

Preferably, the first angle is an obtuse angle.

Preferably, the second supporting feature of the second supporting frame comprises a second supporting section extended from the second longitudinal body of the second supporting frame to form a second angle therebetween. A second supporting space is defined by the second longitudinal body and the pair of second supporting sections. The first supporting section of the first supporting feature of the first supporting frame is located inside the second supporting space to support the second supporting frame.

Preferably, the second angle is an acute angle.

Preferably, the third supporting frame has a pair of third supporting features arranged on the third longitudinal body. The third supporting feature comprises a third supporting section extended from the third longitudinal body of the third supporting frame to form a third angle therebetween. A third supporting space is defined by the third longitudinal body and the pair of third supporting sections. The second supporting section of the second supporting feature of the second supporting frame is located inside the third supporting space to support the third supporting frame.

Preferably, the third angle is an acute angle.

Preferably, the first supporting feature of the first supporting frame comprises a first supporting section, a first extension section, a first bending section and a second bending section. The first supporting section is substantially perpendicularly extended from the first longitudinal body of the first supporting frame. The first extension section is substantially perpendicularly extended from the first supporting section. The first bending section is substantially perpendicularly extended from the first extension section. The second bending section is substantially perpendicularly extended from the first bending section. A first supporting space is defined by the first longitudinal body, the pair of first supporting sections, the pair of first extension sections, the pair of first bending sections and the pair of second bending sections.

Preferably, the second supporting feature of the second supporting frame comprises a second supporting section and a second extension section substantially perpendicularly connected to the second supporting section. The second supporting section is substantially perpendicularly extended from the second longitudinal body of the second supporting frame. A second supporting space is defined by the second longitudinal body, the pair of second supporting sections and the pair of second extension sections. The first supporting section and the first extension section of the first supporting feature of the first supporting frame are located inside the second supporting space to support the second supporting frame.

Preferably, the third supporting frame has a pair of third supporting features arranged on the third longitudinal body. The third supporting feature comprises a third supporting section and a third extension section substantially perpendicularly connected to the third supporting section. The third supporting section is substantially perpendicularly extended from the third longitudinal body of the third supporting frame. A third supporting space is defined by the third longitudinal body, the pair of third supporting sections and the pair of third extension sections. The second supporting section and the second extension section of the second supporting feature of the second supporting frame are located inside the third supporting space to support the third supporting frame.

According to another embodiment of the present invention, a supporting device for rail member is configured to be mounted to a rack. The rack comprises a first post and a second post. The supporting device comprises a first supporting frame having a first longitudinal body, wherein the first supporting frame is fixedly attached to a rail member; a second supporting frame movably attached to the first supporting frame, the second supporting frame having a second longitudinal body; a third supporting frame movably attached to the second supporting frame, the third supporting frame having a third longitudinal body; a first bracket arranged on one of the rail member and the first supporting frame, and configured to be mounted to the first post; and a second bracket arranged on one of the second supporting frame and the third supporting frame, and configured to be mounted to the second post.

Preferably, each of the first and second brackets comprises a side wall and an end wall substantially perpendicularly connected to the side wall. A first fastening member is arranged on the first bracket to fasten the first post. A second fastening member is arranged on the second bracket to fasten the second post.

Preferably, the rail member has a first side and a second side opposite to the first side. A passage is defined by the first side. The supporting device is attached to the second side of the rail member. Wherein, the rail member is an outer rail configured to support a middle rail. The middle rail is movable within the passage of the rail member and configured to support an inner rail. The inner rail is movable relative to the middle rail.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
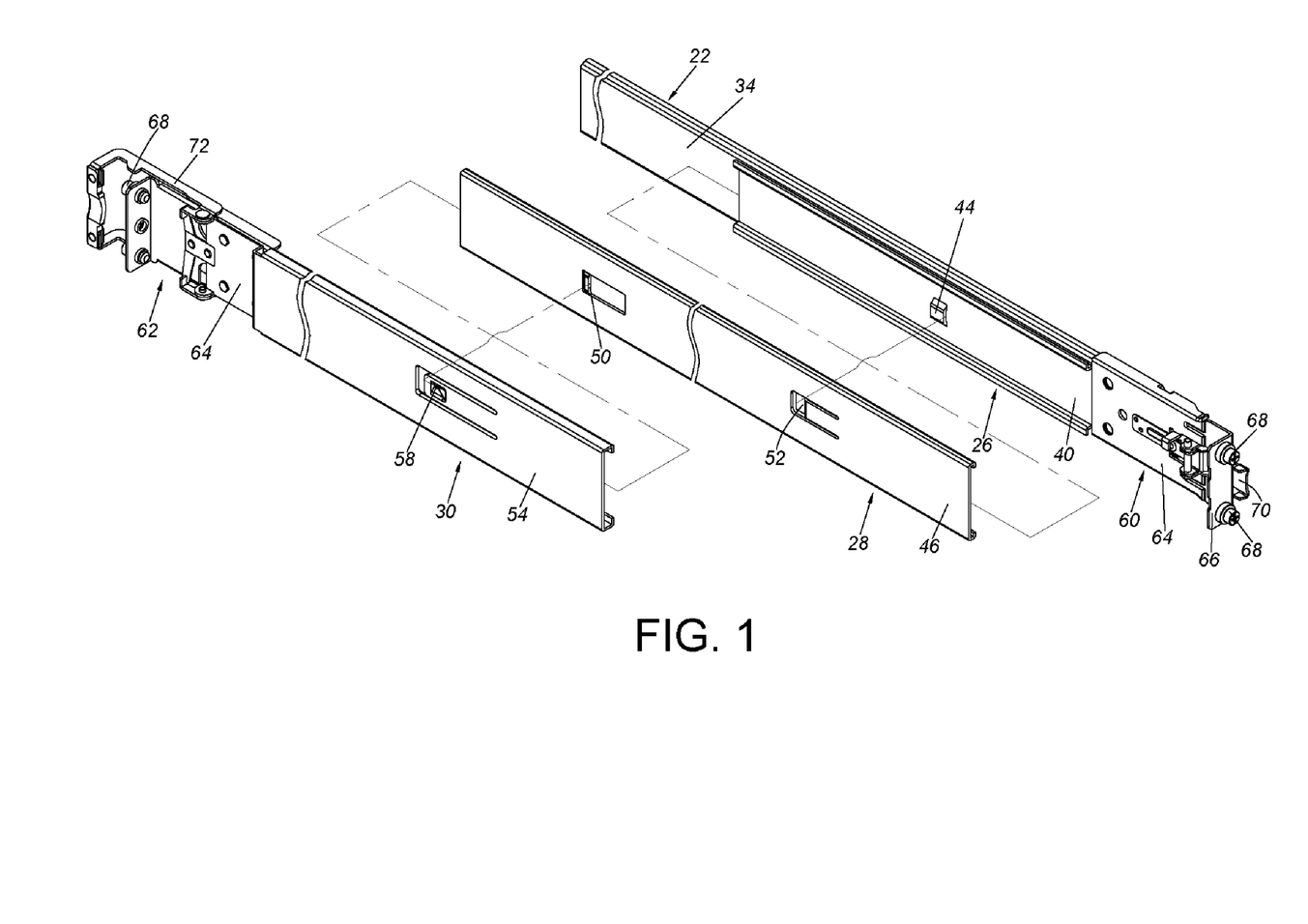
FIG. 1 is an exploded view of a supporting device of a first embodiment of the present invention.
Figure 2:
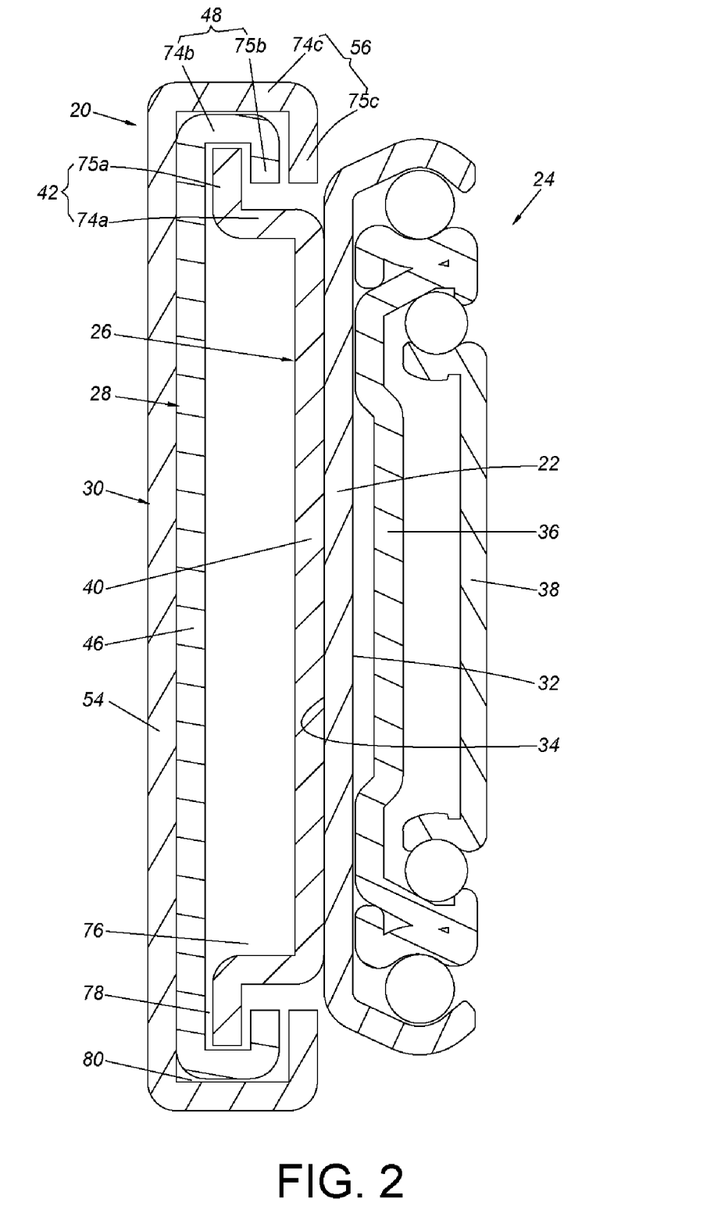
FIG. 2 is a cross-sectional view of the supporting device of the first embodiment of the present invention attached to a slide rail assembly.

As shown in FIG. 1 and FIG. 2, a supporting device 20 of a first embodiment of the present invention is configured to support a rail member 22 or a slide rail assembly 24. The supporting device 20 comprises a first supporting frame 26, a second supporting frame 28 and a third supporting frame 30. Wherein, the rail member 22 has a first side 32 and a second side 34 opposite to the first side 32. The first side 32 defines a passage. The supporting device 20 is attached to the second side 34 of the rail member 22. In addition to the rail member 22, the slide rail assembly 24 further comprises other rails such as a middle rail 36 and an inner rail 38. Wherein, the rail member 22 can be seen as an outer rail configured to support the middle rail 36. The middle rail 36 is movable within the passage of the rail member 22. The middle rail 36 is configured to support the inner rail 38. The inner rail 38 is movable relative to the middle rail 36.

The first supporting frame 26 has a first longitudinal body 40. A pair of first transverse parts is arranged on the first longitudinal body 40. Each of the first transverse parts has a first supporting feature 42. Preferably, the first longitudinal body 40 has a first blocking part 44, such as a protrusion. In the embodiment of FIG. 2, the first supporting frame 26 is fixedly attached to the second side 34 of the rail member 22.

In the present invention, the term "fixedly attached" includes but not limited to connection of riveting, welding, screwing and/or engaging.

The second supporting frame 28 is movably attached to the first supporting frame 26. The second supporting frame 28 has a second longitudinal body 46. A pair of second transverse parts is arranged on the second longitudinal body 46. Each of the second transverse parts has a second supporting feature 48. Preferably, the second longitudinal body 46 has a second blocking part 50 and a second elastic part 52. The second blocking part 50 and the second elastic part 52 are separately arranged on the second longitudinal body 46. Wherein, the second elastic part 52 is able to be elastically cross over the first blocking part 44 of the first supporting frame 26 when attaching the second supporting frame 28 to the first supporting frame 26. When the second supporting frame 28 is moved relative to the first supporting frame 26 to a predetermined position, the second elastic part 52 is configured to abut against the first blocking part 44 for limiting traveling distance of the second supporting frame 28 relative to the first supporting frame 26.

The third supporting frame 30 is movably attached to the second supporting frame 28. The third supporting frame 30 has a third longitudinal body 54. A pair of third transverse parts is arranged on the third longitudinal body 54. Each of the third transverse parts has a third supporting feature 56. Preferably, the third longitudinal body 54 has a third elastic part 58. The third elastic part 58 is able to be elastically cross over the second blocking part 50 of the second supporting frame 28 when attaching the third supporting frame 30 to the second supporting frame 28. When the third supporting frame 30 is moved relative to the second supporting frame 28 to a predetermined position, the third elastic part 58 is configured to abut against the second blocking part 50, such that the second supporting frame 28 can be driven by the third supporting frame 30 to move.

As shown in FIG. 1, the supporting device 20 further comprises a first bracket 60 arranged adjacent to one end of the rail member 22, and a second bracket 62 arranged adjacent to one end of the third supporting frame 30. Wherein, each of the first and second brackets comprises a side wall 64, an end wall 66 substantially perpendicularly connected to the side wall 64, and at least one mounting member 68 arranged on the end wall 66. Preferably, a first fastening member 70 is arranged on the first bracket 60, and a second fastening member 72 is arranged on the second bracket 62. On the other hand, since the first supporting frame 26 is fixedly attached to the rail member 22, the first bracket 60 is arranged on one of the rail member 22 and the first supporting frame 26, and the second bracket 62 is arranged on one of the second supporting frame 28 and the third supporting frame 30. In the embodiment of FIG. 1, the first bracket 60 is arranged on the rail member 22, and the second bracket 62 is arranged on the third supporting frame 30.

As shown in FIG. 2, the first supporting feature 42 of the first supporting frame 26 comprises a first supporting section 74*a* and a first extension section 75*a* substantially perpendicularly connected to the first supporting section 74*a*. Wherein, the first supporting section 74*a* is substantially perpendicularly extended from the first longitudinal body 40 of the first supporting frame 26. A first supporting space 76 is defined by the first longitudinal body 40 and the pair of first supporting sections 74*a*. The first extension section 75*a* is located outside the first supporting space 76.

FIG. 2 further shows the second supporting feature 48 of the second supporting frame 28 comprising a second supporting section 74*b* and a second extension section 75*b* substantially perpendicularly connected to the second supporting section 74*b*. Wherein, the second supporting section 74*b* is substantially perpendicularly extended from the second longitudinal body 46 of the second supporting frame 28. A second supporting space 78 is defined by the second longitudinal body 46, the pair of second supporting sections 74*b* and the pair of second extension sections 75*b*. The first extension section 75*a* of the first supporting feature 42 of the first supporting frame 26 is located inside the second supporting space 78 to support the second supporting frame 28.

FIG. 2 further shows the third supporting feature 56 of the third supporting frame 30 comprising a third supporting section 74*c* and a third extension section 75*c* substantially perpendicularly connected to the third supporting section 74*c*. Wherein, the third supporting section 74*c* is substantially perpendicularly extended from the third longitudinal body 54 of the third supporting frame 30. A third supporting space 80 is defined by the third longitudinal body 54, the pair of third supporting sections 75*c* and the pair of third extension sections 75*c*. The second supporting section 74*b* and the second extension section 75*b* of the second supporting feature 48 of the second supporting frame 28 are located inside the third supporting space 80 to support the third supporting frame 30.

Figure 3:
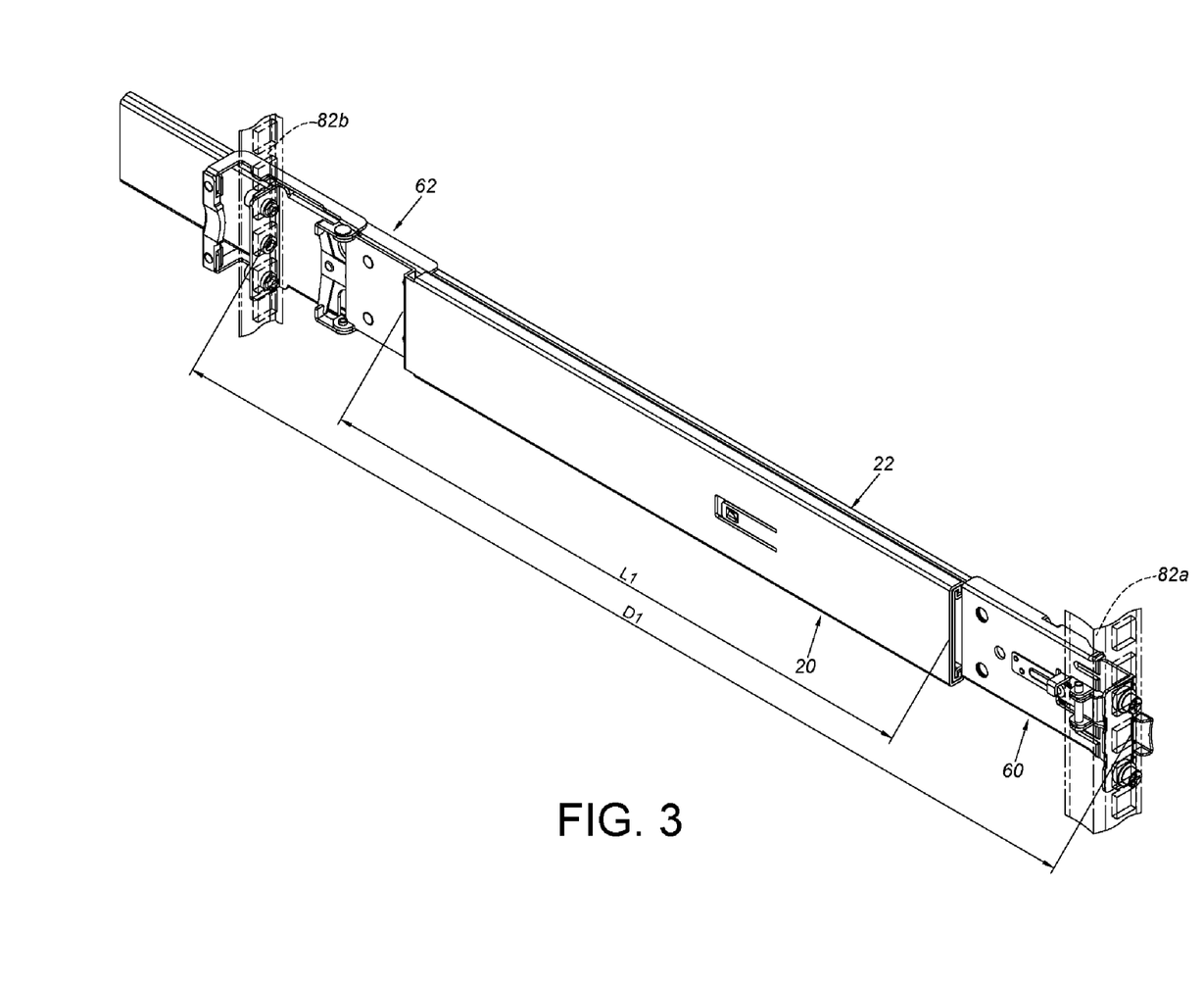
FIG. 3 is a diagram showing the supporting device of the first embodiment of the present invention being mounted to a rack having a first depth.

As shown in FIG. 3, the supporting device 20 is applicable to a first rack with a first depth D1. The first rack comprises a first post 82*a* and a second post 82*b*. The first depth D1 is defined between the first post 82*a* and the second post 82*b*. Specifically, a user can adjust an extension length of the supporting device 20 to be equal to a first length L1 corresponding to the first depth D1. Moreover, the supporting device 20 is configured to be mounted to the first post 82*a* and the second post 82*b* respectively through the first bracket 60 and the second bracket 62.

Figure 4:
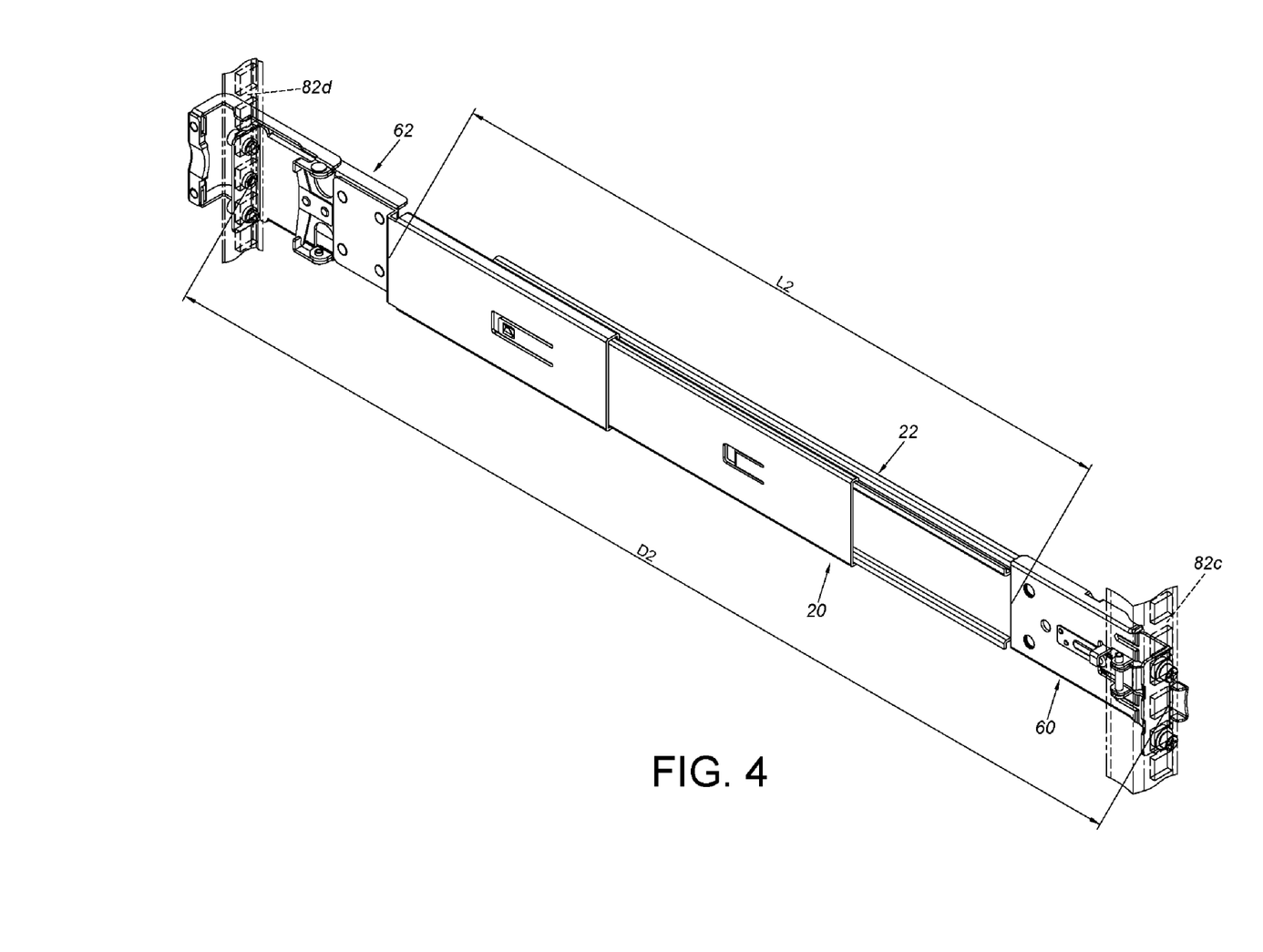
FIG. 4 is a diagram showing the supporting device of the first embodiment of the present invention being mounted to a rack having a second depth according to the first embodiment of the present invention.

As shown in FIG. 4, the supporting device 20 is applicable to a second rack with a second depth D2. The second rack comprises two other posts, such as a third post 82*c* and a fourth post 82*d*. The second depth D2 is defined between the third post 82*c* and the fourth post 82*d*. Specifically, the user can adjust the extension length of the supporting device 20 to be equal to a second length L2 corresponding to the second depth D2. Moreover, the supporting device 20 is configured to be mounted to the third post 82*c* and the fourth post 82*d* respectively through the first bracket 60 and the second bracket 62.

Figure 5:
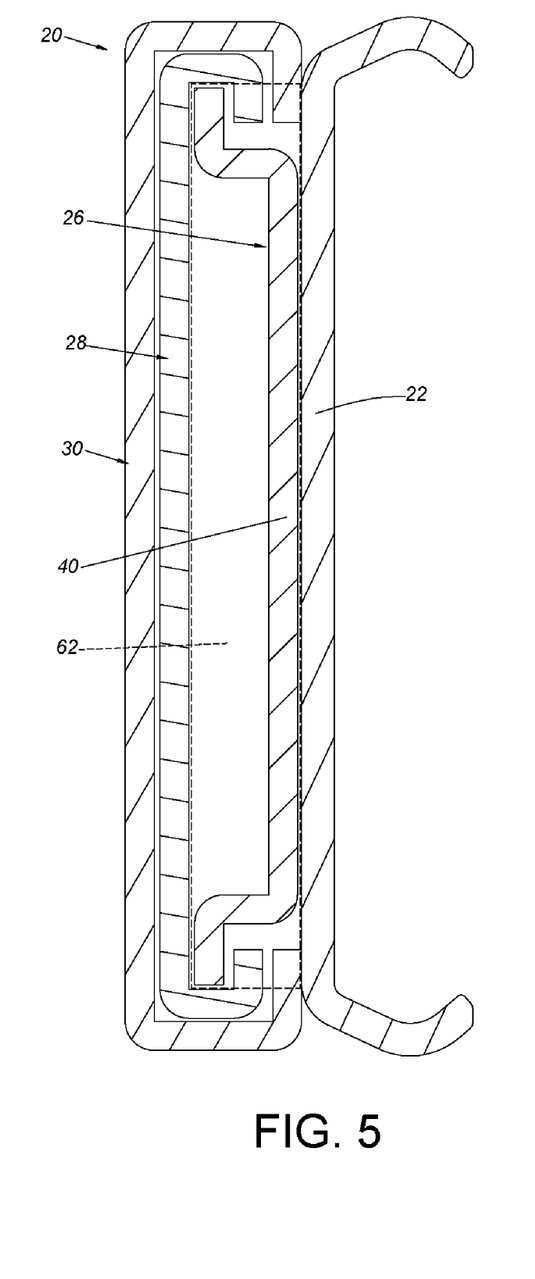
FIG. 5 is a diagram showing another configuration between a rail member and the supporting device of the first embodiment of the present invention.

FIG. 5 is a diagram showing another configuration between the rail member 20 and the supporting device 20 of the first embodiment of the present invention. In FIG. 5, the third supporting frame 30 is fixedly attached to the rail member 22. Since the third supporting frame 30 is fixedly attached to the rail member 22, the first bracket 60 can be selectively mounted to one of the rail member 22 and the third supporting frame 30, and the second bracket 62 can be selectively mounted to one of the first supporting frame 26 and the second supporting frame 28 of the supporting device 20. In the embodiment of FIG. 5, the second bracket 62 is mounted to the first supporting frame 26 of the supporting device 20. As such, a length of the first longitudinal body 40 of the first supporting frame 26 is greater than those of the second supporting frame 28 and the third supporting frame 30.

Figure 6:
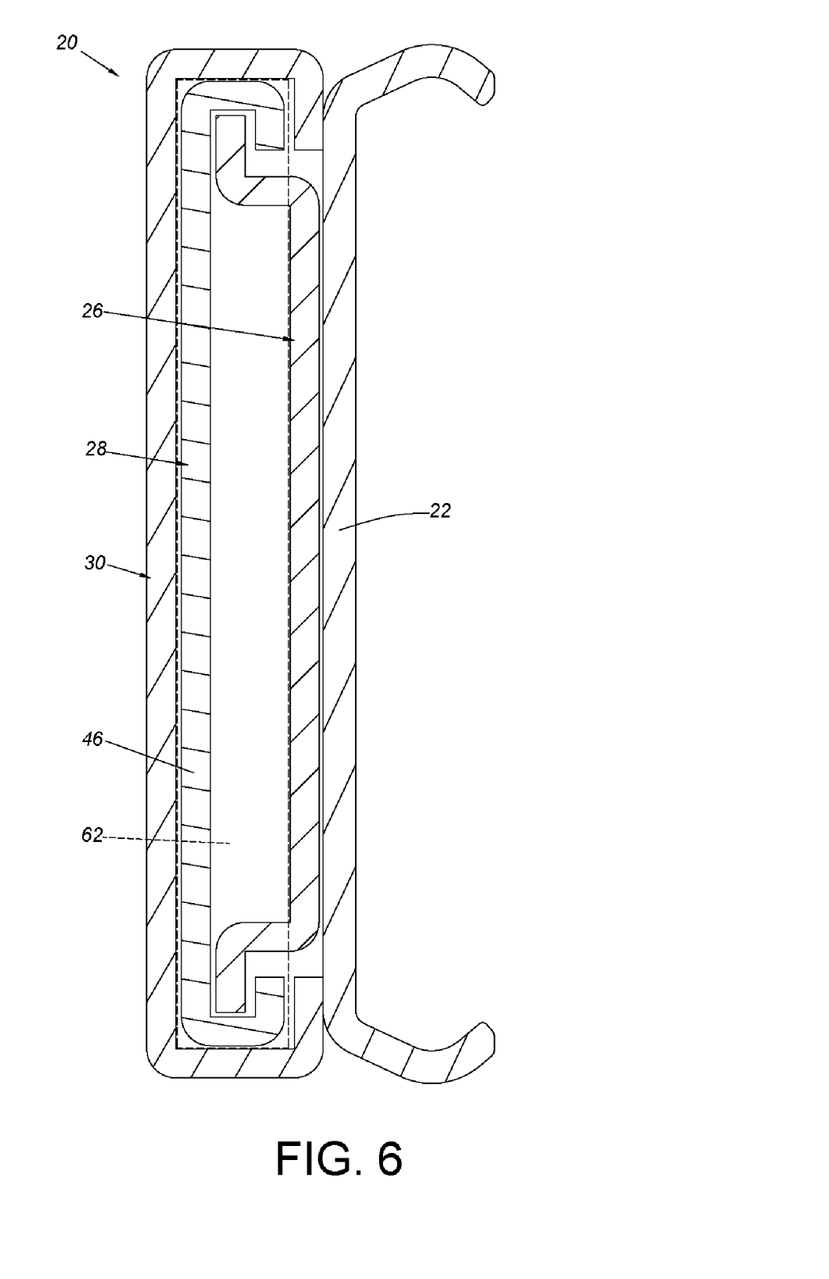
FIG. 6 is a diagram showing another configuration between the rail member and the supporting device of the first embodiment of the present invention.

FIG. 6 is a diagram showing another configuration between the rail member 22 and the supporting device 20 of the first embodiment of the present invention. In the embodiment of FIG. 6, the third supporting frame 30 is fixedly attached to the rail member 22, and the second bracket 62 is mounted to the second supporting frame 28 of the supporting device 20. As such, a length of the second longitudinal body 46 of the second supporting frame 28 is greater than those of the first supporting frame 26 and the third supporting frame 30.

Figure 7:
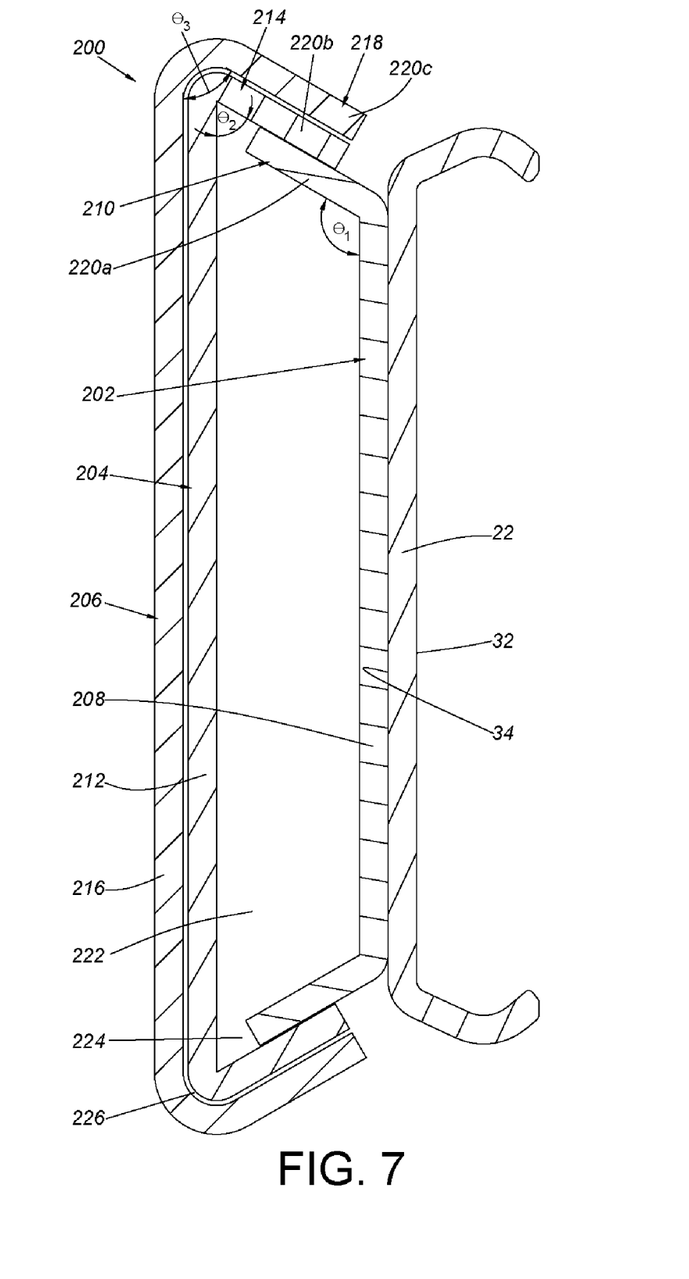
FIG. 7 is a diagram showing a configuration between the rail member and a supporting device of a second embodiment of the present invention.

FIG. 7 is a diagram showing a configuration between the rail member 22 and a supporting device 200 of a second embodiment of the present invention. The supporting device 200 comprises a first supporting frame 202, a second supporting frame 204 and a third supporting frame 206. Wherein, the supporting device 200 is attached to the second side 34 of the rail member 22. A pair of first transverse parts is arranged on the first supporting frame 202. Each of the first transverse parts has a first supporting feature 210. In the embodiment of FIG. 7, the first supporting frame 202 is fixedly attached to the second side 34 of the rail member 22. The second supporting frame 204 is movably attached to the first supporting frame 202. The second supporting frame 204 has a second longitudinal body 212. A pair of second transverse parts is arranged on the second longitudinal body 212. Each of the second transverse parts has a second supporting feature 214. The third supporting frame 206 is movably attached to the second supporting frame 204. The third supporting frame 206 has a third longitudinal body 216. A pair of third transverse parts is arranged on the third longitudinal body 216. Each of the third transverse parts has a third supporting feature 218.

Specifically, the first supporting feature 210 of the first supporting frame 202 comprises a first supporting section 220a extended from the first longitudinal body 208 of the first supporting frame 202 to form a first angle θ1 therebetween. A first supporting space 222 is defined by the first longitudinal body 208 and the pair of first supporting sections 22a.

Specifically, the second supporting feature 214 of the second supporting frame 204 comprises a second supporting section 220b extended from the second longitudinal body 212 of the second supporting frame 204 to forma second angle θ2 therebetween. A second supporting space 224 is defined by the second longitudinal body 212 and the pair of second supporting sections 220b. The first supporting section 220a of the first supporting feature 210 of the second supporting frame 202 is located inside the second supporting space 224 to support the second supporting frame 204.

Specifically, the third supporting feature 218 of the third supporting frame 206 comprises a third supporting section 220c extended from the third longitudinal body 216 of the third supporting frame 206 to form a third angle θ3 therebetween. A third supporting space 226 is defined by the third longitudinal body 216 and the pair of third supporting sections 220c. The second supporting section 220b of the second supporting feature 214 of the second supporting frame 204 is located inside the third supporting space 226 to support the third supporting frame 206.

Preferably, the first angle θ1 is an obtuse angle (90 degrees<θ1<180 degrees). On the other hand, each of the second angle θ2 and the third angle θ3 is an acute angle (0 degree<θ2<90 degrees, 0 degree<θ3<90 degrees).

Figure 8:
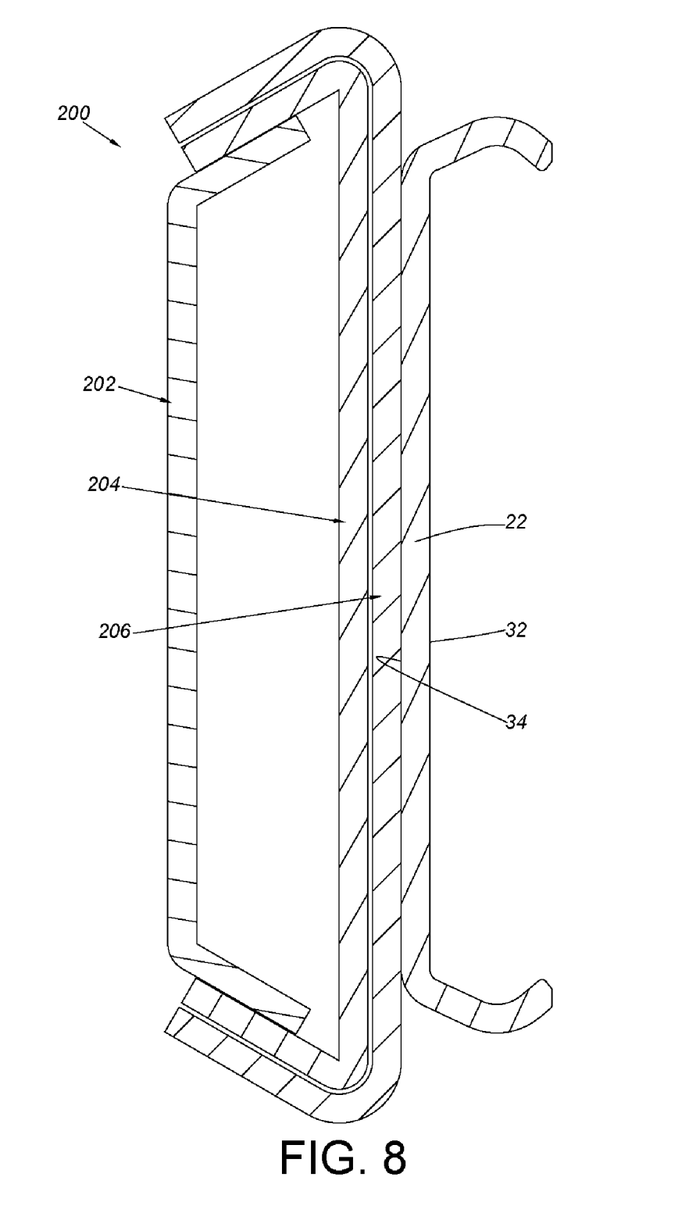
FIG. 8 is a diagram showing another configuration between the rail member and the supporting device of the second embodiment of the present invention.

FIG. 8 is a diagram showing another configuration between the rail member 22 and the supporting device 200 of the second embodiment of the present invention. In the embodiment of FIG. 8, the third supporting frame 206 of the supporting device 200 is fixedly attached to the second side 34 of the rail member 22.

Figure 9:
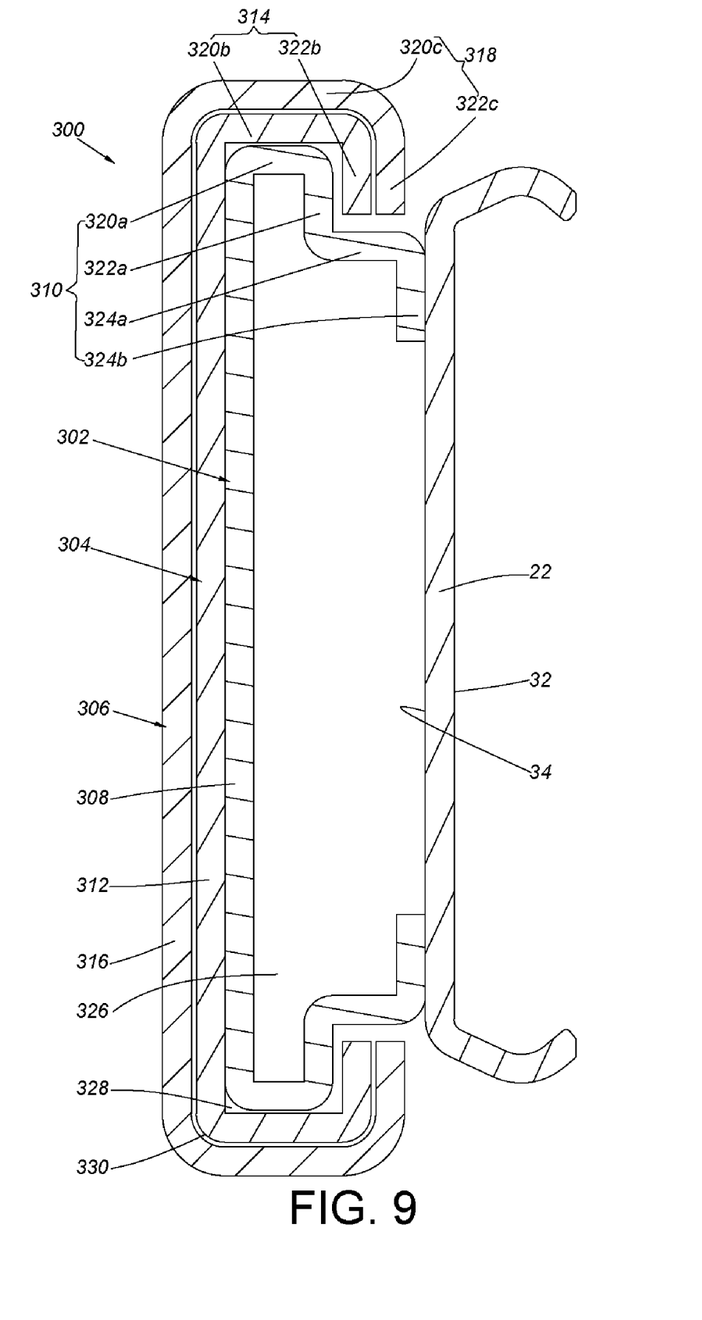
FIG. 9 is a diagram showing a configuration between the rail member and a supporting device of a third embodiment of the present invention.

FIG. 9 is a diagram showing a configuration between the rail member 22 and a supporting device 300 of a third embodiment of the present invention. The supporting device 300 comprises a first supporting frame 302, a second supporting frame 304 and a third supporting frame 306. Wherein, the supporting device 300 is attached to the rail member 22. The first supporting frame 302 has a first longitudinal body 308. A pair of first transverse parts is arranged on the first longitudinal body 308. Each of the first transverse part has a first supporting feature 310. In the embodiment of FIG. 9, the first supporting frame 302 is fixedly attached to the second side 34 of the rail member 22. The second supporting frame 304 is movably attached to the first supporting frame 302. The second supporting frame 304 has a second longitudinal body 312. A pair of second transverse parts is arranged on the second longitudinal body 312. Each of the second transverse parts has a second supporting feature 314. The third supporting frame 306 is movably attached to the second supporting frame 304. The third supporting frame 306 has a third longitudinal body 316. A pair of third transverse parts is arranged on the third longitudinal body 316. Each of the third transverse parts has a third supporting feature 318.

Specifically, the first supporting feature 310 of the first supporting frame 302 comprises a first supporting section 320a, a first extension section 322a, a first bending section 324a and a second bending section 324b. The first supporting section 320a is substantially perpendicularly extended from the first longitudinal body 308 of the first supporting frame 302. The first extension section 322a is substantially perpendicularly extended from the first supporting section 320a. The first bending section 324a is substantially perpendicularly extended from the first extension section 322a. The second bending section 324b is substantially perpendicularly extended from the first bending section 324a. A first supporting space 326 is defined by the first longitudinal body 308, the pair of first supporting sections 320a, the pair of first extension sections 322a, the pair of first bending sections 324a and the pair of second bending sections 324b together define.

Specifically, the second supporting feature 314 of the second supporting frame 304 comprises a second supporting section 320b and a second extension section 322b substantially perpendicularly connected to the second supporting section 320b. Wherein, the second supporting section 320b is substantially perpendicularly extended from the second longitudinal body 312 of the second supporting frame 304. A second supporting space 328 is defined by the second longitudinal body 312, the pair of second supporting sections 320b and the pair of second extension sections 322b. The first supporting section 320a and the first extension section 322a of the first supporting feature 310 of the first supporting frame 302 are located inside the second supporting space 328 to support the second supporting frame 304.

Specifically, the third supporting feature 318 of the third supporting frame 306 comprises a third supporting section 320c and a third extension section 322c substantially perpendicularly connected to the third supporting section 320c. Wherein, the third supporting section 320c is substantially perpendicularly extended from the third longitudinal body 316 of the third supporting frame 306. A third supporting space 330 is defined by the third longitudinal body 316, the pair of third supporting sections 320c and the pair of third extension sections 322c. The second supporting section 320b and the second extension section 322b of the second supporting feature 314 of the second supporting frame 304 are located inside the third supporting space 330 to support the third supporting frame 306.

Figure 10:
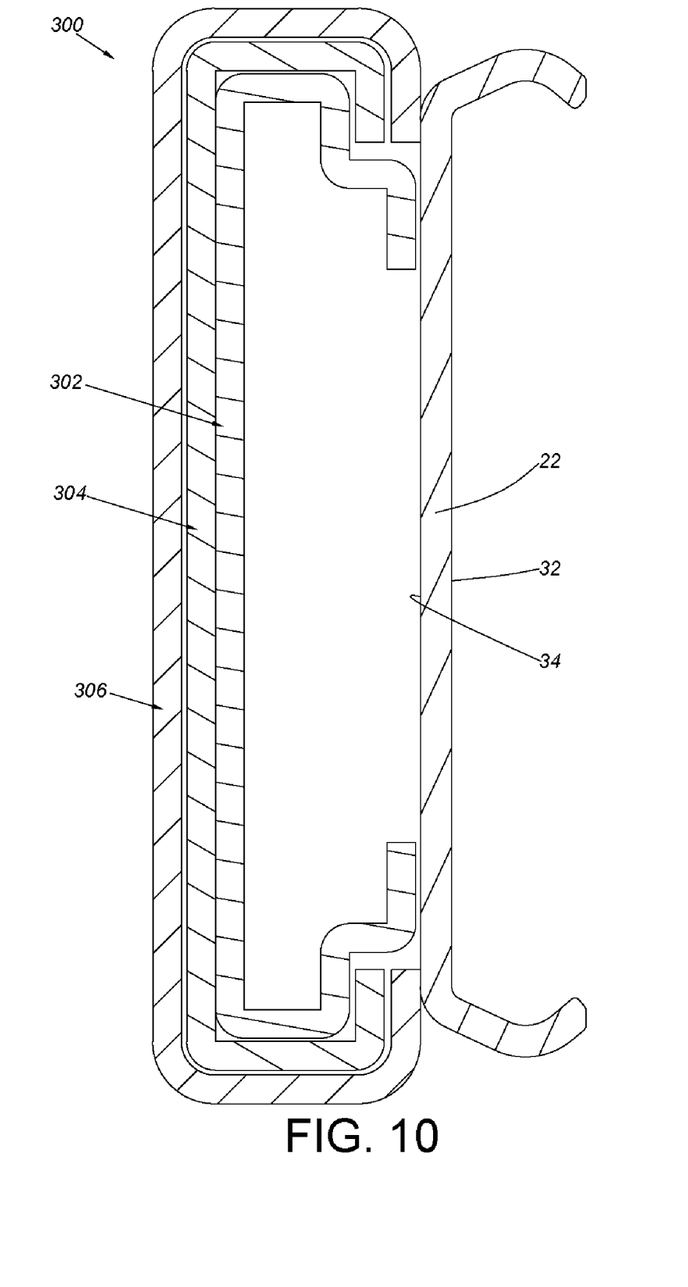
FIG. 10 is a diagram showing another configuration between the rail member and the supporting device of the third embodiment of the present invention.

FIG. 10 is a diagram showing another configuration between the rail member 22 and the supporting device 300 of the third embodiment of the present invention. In the embodiment of FIG. 10, the third supporting frame 306 of the supporting device 300 is fixedly attached to the second side 34 of the rail member 22.

Summarizing the above, the present invention provides the supporting device to allow the rail member to be mounted to the racks with different depths, in order to meet different requirements. Moreover, the supporting device has a supporting structure with three supporting frames, so as to increase supporting strength and supporting span.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A supporting device for rail member comprising:
a first supporting frame having a first longitudinal body, a pair of first transverse parts being arranged on the first longitudinal body, each of the first transverse parts having a first supporting feature;
a second supporting frame movably attached to the first supporting frame, the second supporting frame having a second longitudinal body, a pair of second transverse parts being arranged on the second longitudinal body, each of the second transverse parts having a second supporting feature; and
a third supporting frame movably attached to the second supporting frame, the third supporting frame having a third longitudinal body;
wherein one of the first supporting frame and the third supporting frame is fixedly attached to a rail member;
wherein the first supporting feature of the first supporting frame is configured to support the second supporting frame, and the second supporting feature of the second supporting frame is configured to support the third supporting frame;
wherein when the first supporting frame is fixedly attached to the rail member, a first bracket is arranged on one of the rail member and the first supporting frame, and a second bracket is arranged on one of the second supporting frame and the third supporting frame, each of the first and second brackets comprises a side wall and an end wall substantially perpendicularly connected to the side wall.

2. The supporting device of claim 1, wherein when the third supporting frame is fixedly attached to the rail member, a first bracket is arranged on one of the rail member and the third supporting frame, and a second bracket is arranged on one of the first supporting frame and the second supporting frame, each of the first and second brackets comprises a side wall and an end wall substantially perpendicularly connected to the side wall.

3. The supporting device of claim 1, wherein the first supporting feature of the first supporting frame comprises a pair of first supporting sections and a pair of first extension sections, the pair of first extension sections are respectively substantially perpendicularly connected to the pair of first supporting sections, the pair of first supporting sections are respectively substantially perpendicularly extended from the first longitudinal body of the first supporting frame, a first supporting space is defined by the first longitudinal body and the pair of first supporting sections, the pair of first extension sections are located outside the first supporting space.

4. The supporting device of claim 3, wherein the second supporting feature of the second supporting frame comprises a pair of second supporting sections and a pair of second extension sections respectively substantially perpendicularly connected to the second supporting section, the pair of second supporting sections are respectively substantially perpendicularly extended from the second longitudinal body of the second supporting frame, a second supporting space is defined by the second longitudinal body, the pair of second supporting sections and the pair of second extension sections, the pair of first extension sections of the first supporting feature of the first supporting frame are located inside the second supporting space to support the second supporting frame.

5. The supporting device of claim 4, wherein the third supporting frame comprises a pair of third supporting features arranged on the third longitudinal body, the third supporting feature comprises a pair of third supporting sections and a pair of third extension sections respectively substantially perpendicularly connected to the pair of third supporting sections, the pair of third supporting sections are respectively substantially perpendicularly extended from the third longitudinal body of the third supporting frame, a third supporting space is defined by the third longitudinal body, the pair of third supporting sections and the pair of third extension sections, the pair of second supporting sections and the pair of second extension sections of the second supporting feature of the second supporting frame are located inside the third supporting space to support the third supporting frame.

6. The supporting device of claim 1, wherein the first supporting feature of the first supporting frame comprises a pair of first supporting sections respectively extended from the first longitudinal body of the first supporting frame to form a pair of first angles therebetween, a first supporting space is defined by the first longitudinal body and the pair of first supporting sections.

7. The supporting device of claim 6, wherein the pair of first angles are an obtuse angle.

8. The supporting device of claim 6, wherein the second supporting feature of the second supporting frame comprises a pair of second supporting sections respectively extended from the second longitudinal body of the second supporting frame to form a pair of second angles therebetween, a second supporting space is defined by the second longitudinal body and the pair of second supporting sections, the pair of first supporting sections of the first supporting feature of the first supporting frame are located inside the second supporting space to support the second supporting frame.

9. The supporting device of claim 8, wherein the pair of second angles are acute angles.

10. The supporting device of claim 8, wherein the third supporting frame has a pair of third supporting features arranged on the third longitudinal body, the third supporting features comprises a pair of third supporting sections respectively extended from the third longitudinal body of the third supporting frame to form a pair of third angles therebetween, a third supporting space is defined by the third longitudinal body and the pair of third supporting sections, the pair of second supporting sections of the second supporting feature of the second supporting frame is located inside the third supporting space to support the third supporting frame.

11. The supporting device of claim 10, wherein the pair of third angles are acute angles.

12. The supporting device of claim 1, wherein the first supporting feature of the first supporting frame comprises a pair of first supporting sections, a pair of first extension sections, a pair of first bending sections and a pair of second bending sections; the pair of first supporting sections are respectively substantially perpendicularly extended from the first longitudinal body of the first supporting frame, the pair of first extension sections are respectively substantially perpendicularly extended from the pair of first supporting sections, the pair of first bending sections are respectively substantially perpendicularly extended from the first extension section, the pair of second bending sections are respectively substantially perpendicularly extended from the pair of first bending sections; a first supporting space is defined by the first longitudinal body, the pair of first supporting sections, the pair of first extension sections, the pair of first bending sections and the pair of second bending sections.

13. The supporting device of claim 12, wherein the second supporting feature of the second supporting frame comprises a pair of second supporting sections and a pair of second extension sections respectively substantially perpendicularly connected to the pair of second supporting sections, the pair of second supporting sections are respectively substantially perpendicularly extended from the second longitudinal body of the second supporting frame, a second supporting space is defined by the second longitudinal body, the pair of second supporting sections and the pair of second extension sections, the pair of first supporting sections and the pair of first extension sections of the first supporting feature of the first supporting frame are located inside the second supporting space to support the second supporting frame.

14. The supporting device of claim 13, wherein the third supporting frame has a pair of third supporting features arranged on the third longitudinal body, the pair of third supporting features comprises a pair of third supporting sections and a pair of third extension sections respectively substantially perpendicularly connected to the pair of third supporting sections, the pair of third supporting sections are respectively substantially perpendicularly extended from the third longitudinal body of the third supporting frame, a third supporting space is defined by the third longitudinal body, the pair of third supporting sections and the pair of third extension sections, the pair of second supporting sections and the pair of second extension sections of the second supporting feature of the second supporting frame are located inside the third supporting space to support the third supporting frame.

15. A supporting device for rail member configured to be mounted to a rack, the rack comprising a first post and a second post, the supporting device comprising:
a first supporting frame having a first longitudinal body, wherein the first supporting frame is fixedly attached to a rail member;
a second supporting frame movably attached to the first supporting frame, the second supporting frame having a second longitudinal body;
a third supporting frame movably attached to the second supporting frame, the third supporting frame having a third longitudinal body;
a first bracket arranged on one of the rail member and the first supporting frame, and configured to be mounted to the first post; and
a second bracket arranged on one of the second supporting frame and the third supporting frame, and configured to be mounted to the second post;
wherein each of the first and second brackets comprises a side wall and an end wall substantially perpendicularly connected to the side wall, a first fastening member is arranged on the first bracket to fasten the first post, a second fastening member is arranged on the second bracket to fasten the second post.

16. The supporting device of claim 15, wherein the rail member has a first side and a second side opposite to the first side, a passage is defined by the first side, the supporting device is attached to the second side of the rail member; wherein the rail member is an outer rail configured to support a middle rail, the middle rail is movable within the passage of the rail member and configured to support an inner rail, the inner rail is movable relative to the middle rail.

17. A supporting device for rail member comprising:
a first supporting frame having a first longitudinal body, a pair of first transverse parts being arranged on the first longitudinal body, each of the first transverse parts having a first supporting feature;
a second supporting frame movably attached to the first supporting frame, the second supporting frame having a second longitudinal body, a pair of second transverse parts being arranged on the second longitudinal body, each of the second transverse parts having a second supporting feature; and
a third supporting frame movably attached to the second supporting frame, the third supporting frame having a third longitudinal body;
wherein one of the first supporting frame and the third supporting frame is fixedly attached to a rail member;
wherein the first supporting feature of the first supporting frame is configured to support the second supporting frame, and the second supporting feature of the second supporting frame is configured to support the third supporting frame;
wherein the first supporting feature of the first supporting frame comprises a pair of first supporting sections and a pair of first extension sections respectively substantially perpendicularly connected to the pair of first supporting sections, the pair of first supporting sections are respectively substantially perpendicularly extended from the first longitudinal body of the first supporting frame, a first supporting space is defined by the first longitudinal body and the pair of first supporting sections, the pair of first extension sections are located outside the first supporting space.

18. The supporting device of claim 17, wherein the second supporting feature of the second supporting frame comprises a pair of second supporting sections and a pair of second extension sections respectively substantially perpendicularly connected to the second supporting section, the pair of second supporting sections are respectively substantially perpendicularly extended from the second longitudinal body of the second supporting frame, a second supporting space is defined by the second longitudinal body, the pair of second supporting sections and the pair of second extension sections, the pair of first extension sections of the first supporting feature of the first supporting frame are located inside the second supporting space to support the second supporting frame.

19. The supporting device of claim 18, wherein the third supporting frame comprises a pair of third supporting features arranged on the third longitudinal body, the third supporting feature comprises a pair of third supporting sections and a pair of third extension sections respectively substantially perpendicularly connected to the pair of third supporting sections, the pair of third supporting sections are respectively substantially perpendicularly extended from the third longitudinal body of the third supporting frame, a third supporting space is defined by the third longitudinal body, the pair of third supporting sections and the pair of third extension sections, the pair of second supporting sections and the pair of second extension sections of the second supporting feature of the second supporting frame are located inside the third supporting space to support the third supporting frame.

20. The supporting device of claim 17, wherein the first supporting feature of the first supporting frame comprises a pair of first supporting sections respectively extended from the first longitudinal body of the first supporting frame to form a pair of first angles therebetween, a first supporting space is defined by the first longitudinal body and the pair of first supporting sections.

21. The supporting device of claim 20, wherein the second supporting feature of the second supporting frame comprises a pair of second supporting sections respectively extended from the second longitudinal body of the second supporting frame to form a pair of second angles therebetween, a second supporting space is defined by the second longitudinal body and the pair of second supporting sections, the pair of first supporting sections of the first supporting feature of the first supporting frame are located inside the second supporting space to support the second supporting frame.

22. The supporting device of claim 21, wherein the third supporting frame has a pair of third supporting features arranged on the third longitudinal body, the third supporting features comprises a pair of third supporting sections respectively extended from the third longitudinal body of the third supporting frame to form a pair of third angles therebetween, a third supporting space is defined by the third longitudinal body and the pair of third supporting sections, the pair of second supporting sections of the second supporting feature of the second supporting frame is located inside the third supporting space to support the third supporting frame.

* * * * *